(12) United States Patent
Posseme et al.

(10) Patent No.: US 9,048,011 B2
(45) Date of Patent: Jun. 2, 2015

(54) METHOD OF OBTAINING PATTERS IN AN ANTIREFLECTIVE LAYER

(71) Applicants: COMMISSARIAT A L'ENERGIE ATOMIQUE ET AUX ENE ALT, Paris (FR); CNRS-Centre National de la Recherche Scientifique, Paris (FR); Universite Joseph Fourier, Grenoble Cedex (FR)

(72) Inventors: Nicolas Posseme, Grenoble (FR); Olivier Joubert, Meylan (FR); Laurent Vallier, Meylan (FR)

(73) Assignees: COMMISSARIAT A L'ENERGIE ATOMIQUE ET AUX ENERGIES ALTERNATIVES, Paris (FR); CNRS—CENTRE NATIONAL DE LA RECHERCHE SCIENTIFIQUE, Paris (FR); UNIVERSITE JOSEPH FOURIER, Grenoble (FR)

( * ) Notice: Subject to any disclaimer, the term of this patent is extended or adjusted under 35 U.S.C. 154(b) by 0 days.

(21) Appl. No.: 14/142,061

(22) Filed: Dec. 27, 2013

(65) Prior Publication Data
US 2014/0183159 A1    Jul. 3, 2014

(30) Foreign Application Priority Data
Dec. 28, 2012   (FR) ..................... 12 62957

(51) Int. Cl.
*H01L 21/311* (2006.01)
*H01B 13/00* (2006.01)
*H01L 21/027* (2006.01)
*H01L 21/3115* (2006.01)
*H01L 21/3213* (2006.01)

(52) U.S. Cl.
CPC ........ *H01B 13/0026* (2013.01); *H01L 21/0276* (2013.01); *H01L 21/31111* (2013.01); *H01L 21/31144* (2013.01); *H01L 21/31155* (2013.01); *H01L 21/32139* (2013.01)

(58) Field of Classification Search
CPC ................... H01L 21/32134; H01L 21/3086; H01L 21/30608; H01L 21/3065; H01L 21/31144; H01L 21/32139; H01L 21/76237; H01L 21/0276; H01L 21/0337; H01L 21/0338; H01L 21/266; H01L 21/3115; H01L 21/32136; H01L 21/32137; Y10S 438/942
See application file for complete search history.

(56) References Cited

U.S. PATENT DOCUMENTS 6,030,898 A    2/2000   Liu
2003/0230549 A1*  12/2003  Buchanan et al. .............. 216/41

FOREIGN PATENT DOCUMENTS

JP          7-161689        6/1995

OTHER PUBLICATIONS
French Preliminary Search Report and Written Opinion issued May 23, 2013, in Patent Application No. FR 1262957, filed Dec. 28, 2012 (With English Translation of Category of Cited Documents).

* cited by examiner

Primary Examiner — Lan Vinh
Assistant Examiner — Jiong-Ping Lu
(74) Attorney, Agent, or Firm — Oblon, McClelland, Maier & Neustadt, L.L.P.

(57) ABSTRACT

The invention relates to the field of production in thin coatings of electronic devices and/or MEMS and relates to an improved method for forming a pattern in a thin SiARC anti-reflective coating, comprising the doping by deposition of such SiARC coating covered with a resist pattern through a protective coating of the resist pattern, then etching the doped zones of the SiARC coating (FIG. 3c).

15 Claims, 5 Drawing Sheets

US 9,048,011 B2

METHOD OF OBTAINING PATTERS IN AN ANTIREFLECTIVE LAYER

TECHNICAL FIELD

The invention relates to the field of methods for forming in thin coatings for example micro-electronic devices or micro-systems and more particularly to the forming of patterns in a thin coating.

It relates to an improved method for forming patterns in a thin, more particularly of the SiARC type, i.e. anti-reflective and silicon-based coating.

STATE OF THE ART

Forming one or several pattern(s) in a thin coating is currently performed using a photolithography method, wherein masking is formed with a resist having a pattern desired to be transferred to the thin coating. The transfer is then performed by etching the thin coating through the resist masking.

It may be desired to transfer again the executed pattern to an underlying coating whereon said thin coating rests.

This may be the case, for example, when the thin coating is a silicon-based anti-reflective coating, more particularly of the SiARC type, and rests on an underlying coating wherein it is desired to form a pattern for example a SiON-, or $SiO_2$- or TiN-based coating.

For this purpose, it may be desired to use again the resist masking as an etching mask.

However, during the forming of the pattern in the thin coating, the resist masking may tend to consume.

The problem is all the more important when the resist masking initially has a small critical dimension. Such undesired consumption of the resist masking may prevent the execution of an accurate pattern in the underlying coating or prevent the integral transfer of the pattern into the underlying coating when the thickness of such underlying coating is too important.

When the thin coating, wherein it is desired to form a pattern is an anti-reflective coating containing silicon of the SiARC type, it is known, to remedy this problem, to provide such coating with an increased concentration in Si so as to enhance the etching selectivity between the material of such thin coating and the resist masking.

Another known solution provides an anisotropic etching in a reactor containing fluorocarbon or $C_xH_y$-based products.

However such method only enables a selectivity limited to 2.

The problem consists in finding a new method for forming patterns in a thin coating having none of the drawbacks mentioned above.

SUMMARY OF THE INVENTION

According to one embodiment, the present invention relates to a method for forming a pattern in a first coating comprising the following steps:
 forming, on a first coating, at least a photoresist-based masking block for example, covering said first coating,
 deposition of the zones of the first coating located on the periphery of said masking block, using at least one dopant species, with the dopant species being selected so that the doped zones are liable to be selectively etched relative to the rest of the first coating and relative to the masking block,
 selective etching of the doped zones of the first coating.
   Such etching selectively consumes the doped zones of the first coating relative to the not doped zones of the first coating and to the masking block.

Advantageously, the deposition of the dopant species in the material of the first coating increases the material etching speed in the zones where it is doped. The zones with deposition then consume more quickly than the zones without deposition of the first coating. The zones with deposition also consume more quickly than the masking block.

The deposition thus makes it possible to etch the first coating using less resist than the known solutions, even using no resist.

The invention makes it possible to obtain patterns having a very high aspect ratio—with the aspect ratio being the ratio of width or diameter (in the $\vec{i}\,\vec{j}$ plane) of the pattern to the height thereof (in the $\vec{k}\,\vec{i}$ plane).

Optionally, the invention provides at least any one of the characteristics and optional steps mentioned hereunder.

Prior to the deposition, the first coating and said masking block are preferably covered with a protective coating. Advantageously, the protective coating protects the resist coating during the deposition, thus preventing the resist to consume during said deposition.

According to a preferred but not restrictive embodiment of the invention, the deposition, more particularly the energy thereof, the concentration of the dopant species or the dose used and the duration of the deposition process are provided so that said doped zones located on the periphery of said masking block and a region without deposition of said first coating located under the masking block have a boundary directly above or extending from the side face(s) of said masking block.

The invention thus makes it possible to form patterns having a still higher aspect ratio without any risk of over-etching under the masking block.

Besides, the protective coating, more particularly the composition and the thickness thereof, is so provided that said doped zones located on the periphery of said masking block and a region without deposition of said first coating located under the masking block have a boundary directly above or extending from the side face(s) of said masking block.

According to a particularly advantageous embodiment, plasma is used for the deposition.

Plasma deposition advantageously enables to make a continuous deposition in a volume extending as from the surface of the coating with deposition.

Besides, using plasma enables a deposition on smaller depths than the minimum depths which can be obtained with implanters. Plasma deposition thus makes it possible to efficiently and relatively homogeneously, or at least continuously, deposit small thicknesses which can be removed afterwards by a selective etching. Such continuous deposition from the face with deposition makes it possible to enhance the modification homogeneity according to depth, which results in a time-constant etching speed of the coating with deposition. Besides, the increased selectivity given by the deposition as compared to the other coatings is effective as from the beginning of the etching of the coating with deposition. The plasma deposition thus enables a significantly enhanced control of the etching accuracy.

The plasma deposition typically makes it possible to deposit, and then to remove, thicknesses extending from the surface of the coating with deposition and on a depth ranging from 0 nm to 100 nm. The conventional implanters enable a deposition in a volume ranging from 30 nm to several hundreds of nanometres. On the contrary, the conventional implanters do not enable to perform a deposition of species between the surface of the coating whereon the deposition is to be performed and on a depth of 30 nm. During the development of the present invention, it has been noted that the implanters do not make it possible to reach a sufficiently constant etching speed in the modified coating and this from the surface of the latter, which thus results in a less accurate etching as compared to what the invention allows.

Using plasma to modify the coating to be removed is thus particularly advantageous within the scope of the invention.

According to a particularly advantageous embodiment, the deposition and the etching of the coating with deposition are executed in the same plasma reactor. Modifying the coating to be removed and performed by a plasma deposition thus enables to modify the coating and the etching in the same chamber, which is very advantageous as regards simplification, duration and cost of the method.

Forming the protective coating, said deposition and said etching are preferably executed in the same plasma reactor.

Said first coating may be a Si-based coating. It is, for example, intended to form a silicon-based hard mask.

The method may be applied to a silicon-based coating such as, for example, a $SiO_2$, or SiON, or SiOC coating.

According to a particularly advantageous embodiment, the first coating is a SiARC anti-reflective coating.

Said masking block is preferably positioned in contact with the first coating. The invention thus avoids having to deposit an intermediary coating between the silicon-based or the SiARC coating to etch the latter.

Said protective coating may have a small thickness and may range from 1 nanometer to 3 nanometres.

A too important thickness of the protective coating prevents from placing the boundary between the doped zones and the not-doped zones directly above or extending from the side face(s) of said masking block.

Said dopant species may be hydrogen-based, which makes it possible to form doped zones including Si—H bonds when the first coating contains Si.

Selective etching can thus be performed, for example, using a wet bath based on hydrofluoric acid (HF) diluted in de-ionized water.

Doping may be executed with low deposition energy, more particularly ranging from 100 eV to 600 eV.

The method according to the invention allows to form patterns using a masking block having a reduced critical dimension, i.e. typically a reduced width as compared to the known solutions. More particularly, the invention enables to perform a so-called «trimming» operation on the masking block while allowing the etching of the first coating on an important depth. A trimming operation knowingly aims at reducing the width of the masking block after it is formed, typically using photolithography. Such trimming operation consumes the flanks of the block and thus reduces the critical dimension of the latter. The drawback usually induced by this operation is that the height of the block is inevitably consumed simultaneously with the flanks. The result is that thinning is necessarily limited since an excessive consuming of the height of the block prevents a subsequent etching of the underlying coating on a satisfactory depth. As it eliminates or reduces the consumption of resist during the etching of the first coating, the invention thus allows a prior thinning of the masking block beyond what the known solutions enable. The invention thus makes it possible to obtain patterns having reduced critical dimensions in the first coating.

According to one embodiment, the masking block forms a mask. The etching is executed when the masking block is positioned on the first coating. If the masking block(s) form(s) a mask, the etching is then executed through said mask.

According to one embodiment, the deposition is executed so that the doped zones extend on a depth greater than the thickness of the first coating.

The method preferably comprises a plurality of cycles each comprising a step of forming the protective coating; a step of deposition of the at least one dopant species and the selective etching of the doped zones of the first coating relative to the not doped zones of the first coating and to the masking block.

According to another embodiment, the deposition is executed so that the doped zones extend on a depth greater than or equal to the thickness of the first coating. The etching then consumes the whole thickness of the first coating.

The first coating may rest on a second coating or an underlying coating wherein it is desired to transfer the pattern executed in the anti-reflective coating. The method according to the invention can thus further comprise, after the selective etching of doped zones of said first coating, the etching of the second coating using the anti-reflective coating as a hard mask.

BRIEF DESCRIPTION OF THE DRAWINGS

The present invention will be more easily understood when reading the description of exemplary, non-restrictive embodiments given for information, while referring to the appended drawings, wherein.

The identical, similar or equivalent parts of the various Figures bear the same reference numbers so as to facilitate the switching from one Figure to another one.

The various parts shown in the Figures do not necessarily have a uniform scale, so that the Figures are more legible.

DETAILED PRESENTATION OF PARTICULAR EMBODIMENTS

A first example of the method, according to the invention, for forming a pattern in a thin coating, will now be described while referring to FIGS. 1A to 1D.

The starting material of the method may include a thin coating 100, so called an underlying coating covered with another thin coating 104 wherein it is desired to form at least one pattern.

The underlying coating 100 may be for example a dielectric material coating such as a $SiO_2$ or a $Si_3N_4$ coating, or for example a metallic coating such as a TiN coating, or for example a carbon coating.

Figure 1A:
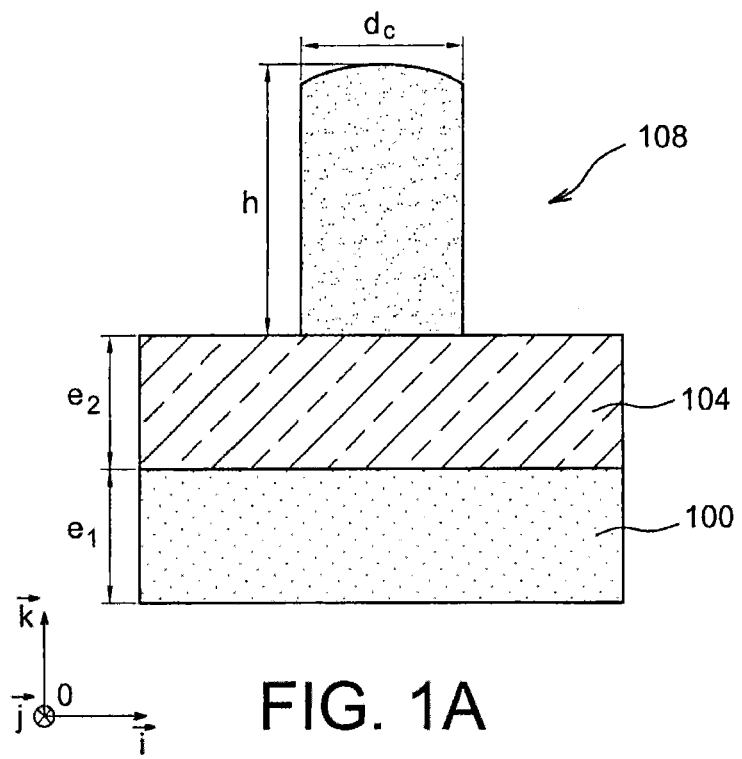
FIGS. 1A-1D illustrate one exemplary method according to the invention for forming patterns in a thin coating, more particularly an anti-reflective coating.

The underlying coating 100 may have a thickness $e_1$ (measured in a direction parallel to the vector $\vec{k}$ of the orthogonal reference system $[O; \vec{i}; \vec{j}; \vec{k}]$ shown in FIG. 1A) ranging for example from 10 nanometres to 80 nanometres.

The other coating 104 resting on the underlying coating 100 and wherein it is desired to form a pattern is an anti-reflective coating which may be silicon-based, and which is currently noted SiARC (ARC for «Anti-Reflective Coating»). The invention however extends to all silicon-based coatings. Thus it makes it possible to define, for example, the patterns of a silicon-based hard mask.

The anti-reflective coating 104 may for example, contain a proportion of Si of the order of 30%, a proportion of oxygen of the order of 50%, a proportion of Carbon of the order of 20%.

Such anti-reflective coating 104 may have a thickness $e_2$, ranging for example from 10 nm nanometres to 80 nm nanometres.

A masking in the form of a photoresist-based block 108, for example, having a pattern which is desired to be reproduced in the anti-reflective coating 104 is formed on the anti-reflective coating 104 beforehand.

The resist-based masking block 108 may have a height h (measured in a direction parallel to the vector $\vec{k}$ of the orthogonal system $[O; \vec{i}; \vec{j}; \vec{k}]$ as shown in FIG. 1A) ranging for example from 30 nanometres to 120 nanometres and a critical dimension dc (defined as the smallest dimension of a pattern except for the thickness or the height thereof and measured in a direction parallel to the plane $[O; \vec{i}; \vec{j}; \vec{k}]$ of the orthogonal system $[O; \vec{i}; \vec{j}; \vec{k}]$) ranging from 10 nanometres to several hundreds nanometres, for example 200 nm.

«Critical dimension», in the present description, means the smallest dimension of an element except for the thickness thereof.

A fine protective coating 110 is then formed on the anti-reflective coating 104 and on the photoresist-based masking block 108. The protective coating 110 is so arranged as to cover the side flanks 108a of the masking block 108 and the top of such block 108.

Such protective coating 110 may be a coating of a dielectric material-based type, currently called a «liner», such as $SiO_2$, $Si_3N_4$, or SiOC.

The thickness $e_3$ of the protective coating 110, more particularly in the zones 110a where the coating covering the side flanks 108a of the resist masking block 108 is selectively weak, for example between 1 nanometer and 3 nanometres.

Figure 1B:
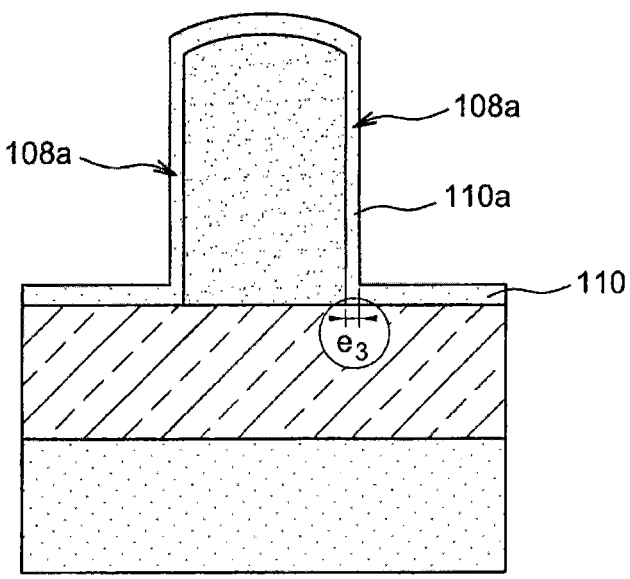

Such thickness $e_3$ is selected according to a step of deposition of the anti-reflective coating 104 to be executed subsequently (FIG. 1B).

The protective coating 110 may be produced in an etching reactor and more particularly in the same reactor as the one used for the other steps of this method. The reactor may be for example of the ICP (ICP for «Inductively Coupled Plasma» or CCP (CCP for «Capacitive Coupled Plasma») type, using a chemical association of the $SiCl_4/O_2$ type or of the $SiF_4/O_2$ type to deposit $SiO_2$ or of the $SiF_4/N_2$ or $SiCl_4/N_2$ type to deposit $Si_3N_4$.

The deposition conditions may be for example such that a $SiCl_4$ or $SiF_4$ rate ranging from 50 to 200 sccm, and a $N_2$ or $O_2$ rate ranging from 10 to 50 sccm, are implemented.

According to a detailed exemplary embodiment, to form a $SiO_2$—based protective coating 110, having a thickness $e_3$ of the order of 3 nm, a method using a reactor of the ICP type with a source power ranging for example from 50 W to 1000 W, as well as a polarisation power ranging for example from 0 W to 1000 W may be used with $SiF_4$ at a rate of 50 sccm and $O_2$ at a rate of 25 sccm, under a pressure of the order of 10 mTorr for 10 seconds.

Then (FIG. 1C), zones 105, 106 of the anti-reflective coating 104 are deposited, and the block 108 is not placed thereon, but the zones are located on the periphery of such block 108.

Such deposition is preferably executed on the whole surface of the plate comprising the anti-reflective coating 104. Such deposition is thus a «full plate» deposition. The masking blocks 108 prevent the deposition of the dopant species in the zones of the anti-reflective coating 104 located under the block 108.

The protective coating 110 is so configured as to prevent the consumption of resist during the deposition. The dopant species may however be with deposition in the resist through the protective coating. Such deposition in the resist however does not consume the latter.

During the deposition, the SiARC coating is not consumed either.

Such deposition is performed using a species intended to enable to form the doped zones 105, 106 liable to be selectively etched relative to the rest of the anti-reflective coating 104.

The deposition may be executed using preferably $H_2$-based plasma when the anti-reflective coating 104 is silicon-based. Plasmas formed from other species are suitable, too.

As mentioned above, a modification of the coating obtained by a plasma deposition has the advantage of enabling a continuous deposition from the free surface of the coating 110 and on a low thickness, typically ranging from 0 to 100 nm even from 0 to 30 nm. It also makes it possible to have a better selectivity from the beginning of the etching and a constant etching speed, leading to a better etching accuracy. It also makes it possible to bring the modification and the removal of the modified coating in the same enclosure.

If the anti-reflective coating 104 contains Si, a hydrogen-based deposition may enable to form Si—H bonds, with an increased HF sensitivity.

The deposition of the dopant species in the masking block 108 does not modify the etching sensitivity thereof. More generally, such deposition increases the etching sensitivity of the masking block 108 less than the etching sensitivity of the SiARC coating 104 in the zones with deposition 105, 106 thereof. Thus, only the zones with deposition 105, 106 of the SiARC coating 104 have an increased etching sensitivity. The deposition thus enables the zones with deposition 105, 106 of the SiARC coating 104 to be more etching-sensitive than the zones without deposition of the SiARC coating and than the masking block 108, in the zones with deposition and without deposition thereof.

The deposition may advantageously be executed in the same reactor as the one wherein the protective coating 110 has been formed.

$H_2$-, HBr- or He-based plasma may be used with a bias power which may be for example greater than 50 W and a source power which may range for example from 0 W to 2000 W, with a duration ranging from several seconds to several minutes, for example of the order of 3 à 4 minutes.

Figure 1C:
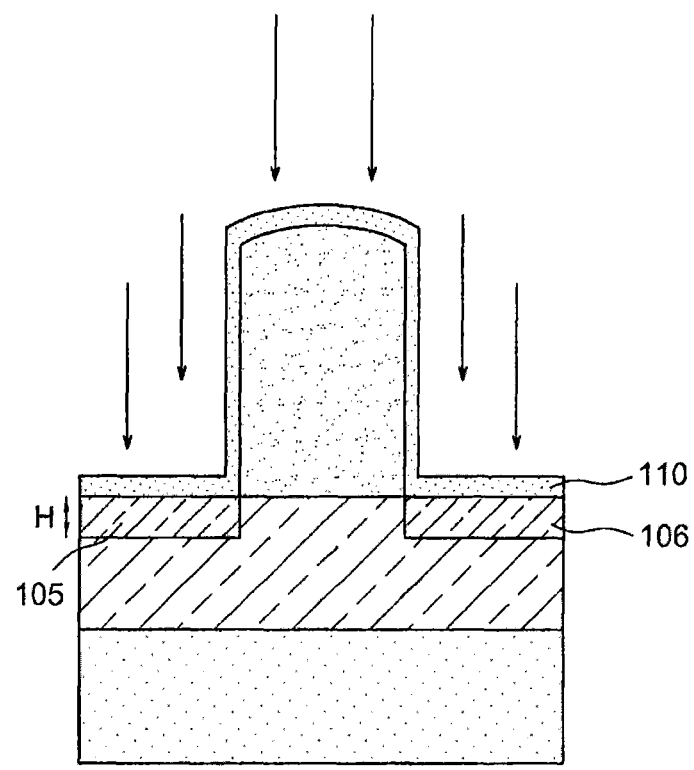

To deposit hydrogen ions on a depth noted Hi, of the order of 10 nm, through a $SiO_2$-based protective coating 110 having a thickness which may be ranging from 1 nm to 3 nm and a Si-based anti-reflective coating 104, a method using $H_2$ with a rate of 200 sccm, with a source power of 500 W, a bias power 150 W, a pressure of mTorr, a duration of 60 sec may be implemented. In FIG. 1C, Hi shows the total deposition depth, in the anti-reflective coating 104 as well as in the resist coating of the masking block 108.

The deposition energy may range, for example from 0.1 keV to 1 keV, for example be less than 500 eV. The deposition depth H in the anti-reflective coating may be smaller than $e_2$ and for example ranging from 5 nm to 30 nm.

The thickness of the protective coating 110, the deposition energy, the concentration of the dopant species or deposition dose, and the deposition duration, are so selected that the boundary F between the doped zones 105, 106 of the anti-reflective coating 104 located around the masking block 108 and a not doped region 107 of such anti-reflective coating 104 located under the masking block 108, is positioned as an extension of the side flanks 108a of the resist block 108 and is aligned with the side flanks 108a of the masking block 108.

The concentration of the species may range, for example, from 50 sccm to 1000 sccm, typically 200 sccm. The deposition duration may range, for example, from 10 sec to 180 sec, typically be of the order of 60 sec.

A deposition without a protective coating 110 would move this boundary under the resist block 108 which would subsequently entail an over-etching and the execution of too narrow a pattern in the anti-reflective coating 104.

A deposition with a protective coating 110 having too important a thickness would move this boundary F beyond the resist block 108. This would subsequently entail the execution of too wide a pattern in the anti-reflective coating 104.

Then, after the deposition, the protective coating 110 is removed. Such removal may be performed simultaneously with that of the doped zones of the anti-reflective coating 104 enabling to reproduce the pattern of the masking block. Then the etching of the doped zones 105, 106 of the anti-reflective coating 104 is executed through the pattern 108 for example by wet etching in a HF solution. A 1% HF solution may be used for example. Advantageously, doping makes it possible to enhance the selectivity of the etching of the SiARC coating in the doped zones thereof, relative to the resist. Then, the resist of the masking block 108 is not consumed, even in the part thereof with deposition, whereas the anti-reflective coating 104 is consumed on the whole thickness H with deposition.

In this case, the duration of the etching is planned to be short enough to keep a correct selectivity between the SiARC doped zones 105, 106 and the rest of the SiARC coating.

Figure 2:
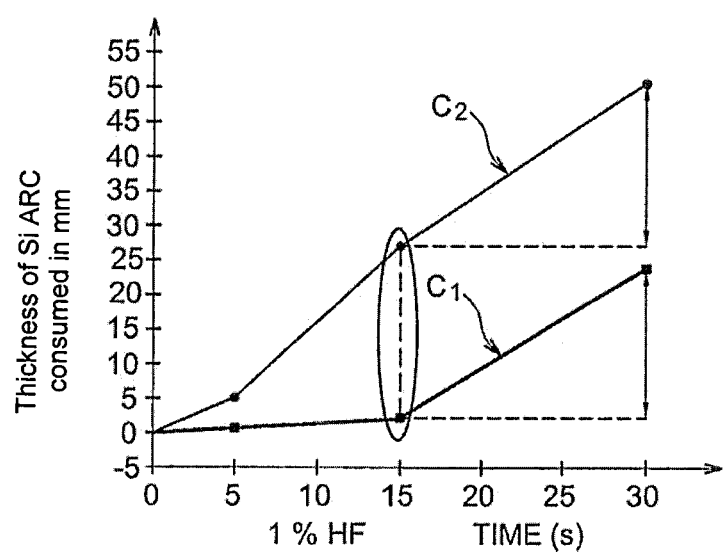
FIG. 2 gives exemplary evolution curves $C_1$, $C_2$ of etched thickness in doped (curve $C_2$) and not-doped (curve $C_1$) SiARC coatings according to the duration of soaking in a HF-based etching solution.

The curves $C_1$ and $C_2$ in FIG. 2 respectively show a consumed thickness of not doped SiARC and a consumed thickness of doped SiARC, according to the duration of soaking in a 1% HF solution. Thus, when, for example, it is desired to etch a SiARC-based coating using a 1% HF solution, a soaking duration ranging from 5 sec to 15 sec may be implemented.

Soaking in a 1% HF solution for a duration of the order of 15 seconds may, for example, enable to remove a thickness of the SiARC-based doped zones 105, 106, of the order of 27 nanometres.

The etching of the anti-reflective coating 104 may be executed in a single step, more particularly when the thickness $e_2$ thereof is smaller than 30 nanometres.

Figure 1D:
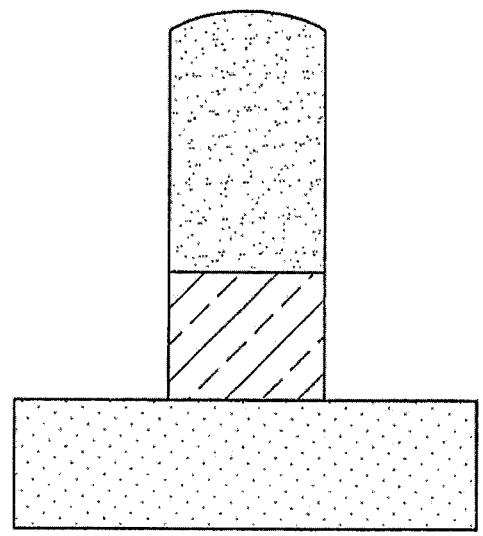

Generally, when the zones with deposition 105 and 106 have a thickness or a depth greater than or equal to the total thickness $e_2$ of the anti-reflective coating 104, then the whole thickness of the anti-reflective coating 104 may be etched in one single step (FIG. 1D).

Figure 3A:
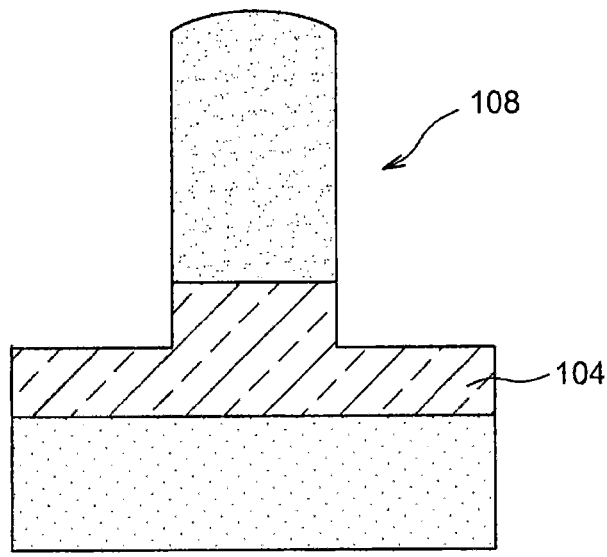
FIGS. 3A-3C and 4 illustrate alternative embodiments of a method according to the invention making it possible to form patterns in a thin coating.

Conversely, when the zones with deposition 105, and 106 have a thickness or a depth smaller than the total thickness $e_2$ of the anti-reflective coating 104, preferably only a portion of the thickness of the anti-reflective coating 104 is etched using a single etching (FIG. 3A). Upon completion of this first etching, the pattern desired to be formed in the anti-reflective coating 104 is partially executed and a thickness of the anti-reflective coating 104 still to be etched remains.

Forming the pattern can then be completed by etching the anti-reflective coating 104 using conventional chemistry such as $CF_4/N_2$ or $HBr/O_2$.

To complete the execution of the pattern in the anti-reflective coating 104, the steps of the method as described while referring to FIGS. 1B and 1C may be repeated, as an alternative solution.

Figure 3B:
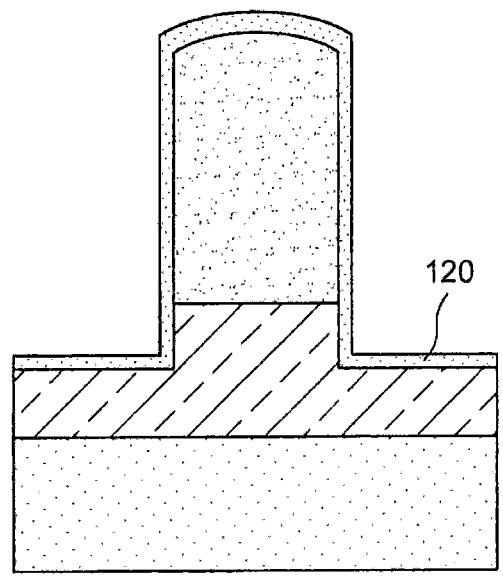

Another protective coating 120 of the same type as the protective coating 110 may then be deposited onto the anti-reflective coating 104 as well as the resist pattern 108 (FIG. 3B), the thickness of which is selected according to a step of deposition to be executed subsequently.

Figure 3C:
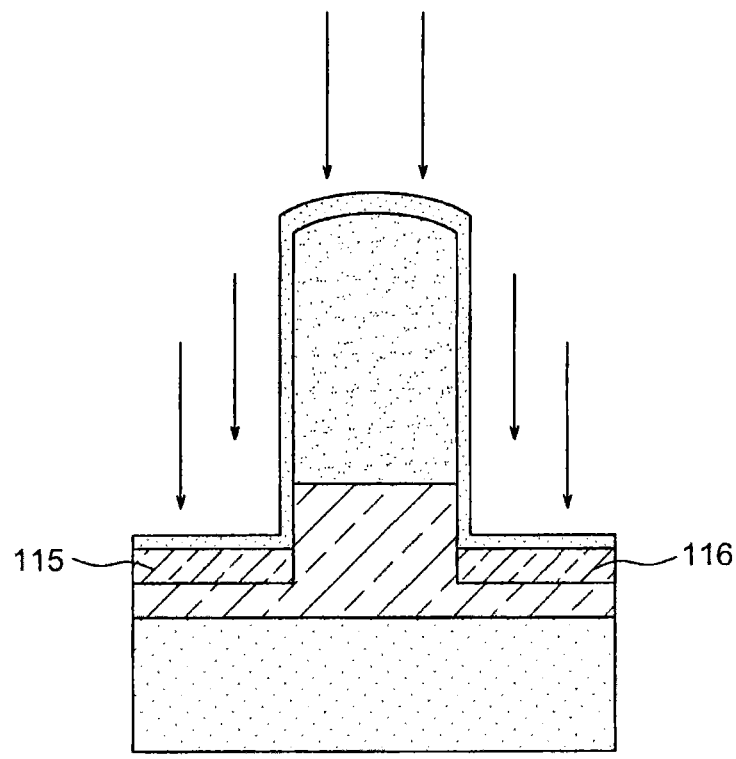

Doping is then executed by deposition of zones 115, 116 of the anti-reflective coating 104 through the protective coating 120 (FIG. 3C).

The protective coating 120 is then removed and the etching of the zones with deposition 115, and 116, is executed so as to proceed with the forming of a pattern in the coating 104.

Such selective etching may be, for example, executed using HF when the zones with deposition 115, and 116 are silicon-based zones and are doped with hydrogen.

After one or several repetition(s) of the method sequence described with reference to FIGS. 1B-1C-3A, a pattern is formed in the sacrificial coating 104 as in FIG. 1D, showing that of the masking block 108.

Figure 4:
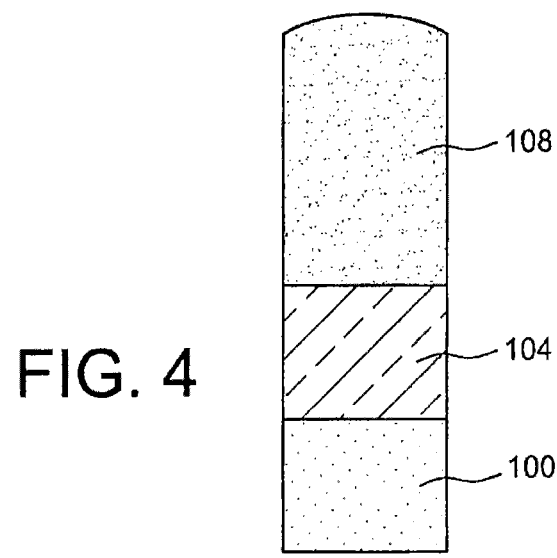

The pattern executed in the anti-reflective coating 104 may be transferred to the underlying coating 100, by anisotropic etching using the anti-reflective coating 104 as a hard mask (FIG. 4).

The invention claimed is:

1. A method for forming a pattern in a first coating comprising:
    forming, on a first coating, covered with at least a photoresist-based masking block resting on said first coating, a protective coating covering the first coating and said masking block,
    plasma deposition of zones of the first coating located on the periphery of said masking block, using at least one dopant species, with the dopant species being selected so that the doped zones are liable to be selectively etched relative to the rest of the first coating and relative to the masking block, with the deposition energy, the deposition duration and the deposition dose thereof, as well as the thickness of the protective coating being provided so that said doped zones located on the periphery of said masking block and a region without deposition of the first coating located under the masking block have a boundary directly above or extending from the side face(s) of said masking block, and
    selective etching of the doped zones of the first coating relative to the not doped zones of the first coating and to the masking block.

2. A method for forming a pattern according to claim 1, wherein said first coating is a Si-based coating.

3. A method for forming a pattern according to claim 1, wherein said first coating is a SiARC anti-reflective coating.

4. A method for forming a pattern according to claim 1, wherein said dopant species is hydrogen-based.

5. A method for forming a pattern according to claim 1, wherein the deposition is performed with a deposition energy ranging from 100 eV to 600 eV.

6. A method for forming a pattern according to claim 1, wherein said protective coating has a thickness ranging from 1 nanometer to 3 nanometers.

7. A method for forming a pattern according to claim 1, wherein said masking block has a critical dimension (dc) ranging from 10 nm to 200 nm.

8. A method for forming a pattern according to claim 1, wherein said selective etching is performed using HF.

9. A method for forming a pattern according to claim 1, wherein said masking block is positioned in contact with the first coating.

10. A method for forming a pattern according to claim 1, wherein the deposition is performed so that the doped zones extend on a depth smaller than the thickness of the first coating.

11. A method for forming a pattern according to claim 1, comprising a plurality of cycles, each comprising said step of forming the protective coating, said step of deposition and said step of selectively etching the doped zones of the first coating relative to the not doped zones of the first coating and to the masking block.

12. A method for forming a pattern according to claim 1, wherein said deposition is performed so that the doped zones extend on a depth greater than or equal to the thickness of the first coating, and wherein said etching consumes the whole thickness of the first coating.

13. A method for forming a pattern according to claim 1, wherein the first coating rests on a second coating, with the method further comprising, after said selective etching of the doped zones of the first coating, etching of the second coating through the first coating.

14. A method for forming a pattern according to claim 1, wherein forming the protective coating, said deposition and said etching are performed in the same plasma reactor.

15. A method for forming a pattern in a first coating comprising [the following steps]:

forming, on a first anti-reflective coating, covered with at least a photoresist-based masking block resting on said first coating, with a protective coating covering the first coating and said masking block, deposition of zones of the first coating located on the periphery of said masking block, using at least one dopant species, with the dopant species being selected so that the doped zones are liable to be selectively etched relative to the rest of the first coating and relative to the masking block, the deposition energy, the deposition duration and the deposition dose thereof, as well as the thickness of the protective coating being provided so that said doped zones located on the periphery of said masking block and a region without deposition of the first coating located under the masking block have a boundary directly above or extending from the side face(s) of said masking block, and selective etching of the doped zones of the first coating relative to the not doped zones of the first coating and to the masking block.

* * * * *